United States Patent
Yashiro et al.

(10) Patent No.: US 6,381,860 B1
(45) Date of Patent: May 7, 2002

(54) ELECTROSTATIC CAPACITOR-TYPE INCLINATION SENSOR

(75) Inventors: Tomohiko Yashiro; Morio Sato, both of Saitama (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/951,409

(22) Filed: Sep. 14, 2001

Related U.S. Application Data

(62) Division of application No. 09/505,879, filed on Feb. 17, 2000, now Pat. No. 6,311,406.

(30) Foreign Application Priority Data

Feb. 18, 1999 (JP) .............................. 11-039528

(51) Int. Cl.[7] .............................. G01C 9/20; G01C 9/06
(52) U.S. Cl. .............................. 33/366.19; 33/366.25; 324/679
(58) Field of Search .......................... 33/366.11, 366.13, 33/366.17, 366.18, 366.19, 366.24, 366.25, 702; 73/1.75; 324/663, 671, 672, 673, 674, 679, 680, 681

(56) References Cited

U.S. PATENT DOCUMENTS

| | | | | |
|---|---|---|---|---|
| 3,487,303 A | * | 12/1969 | Remington | 324/6 |
| 4,093,915 A | | 6/1978 | Briefer | 324/679 |
| 4,468,611 A | * | 8/1984 | Tward | 324/673 |
| 4,468,864 A | * | 9/1984 | Westphal et al. | 33/366.14 |
| 4,641,434 A | * | 2/1987 | Engler | 33/366.19 |
| 4,800,542 A | * | 1/1989 | Franklin et al. | 367/154 |
| 4,937,518 A | * | 6/1990 | Donati et al. | 324/716 |
| 5,083,383 A | * | 1/1992 | Heger | 33/366.19 |
| 5,146,688 A | | 9/1992 | Ito | 33/366.14 |
| 5,172,481 A | | 12/1992 | Wiseman et al. | 33/366.12 |
| 5,237,753 A | | 8/1993 | Carlson et al. | 33/366.14 |
| 5,283,528 A | * | 2/1994 | van Seeters | 324/679 |
| 5,365,671 A | | 11/1994 | Yaniger | 33/366.12 |
| 5,534,773 A | | 7/1996 | Tsugai et al. | 324/105 |
| 5,802,728 A | | 9/1998 | Karnick et al. | 33/366.18 |
| 5,861,754 A | * | 1/1999 | Ueno et al. | 324/660 |
| 6,341,406 B1 | * | 11/2001 | Yashiro et al. | 33/366.19 |

FOREIGN PATENT DOCUMENTS

| | | |
|---|---|---|
| JP | Y2 4-53528 | 12/1992 |
| JP | Y2 5-14168 | 4/1993 |

* cited by examiner

Primary Examiner—Diego Gutierrez
Assistant Examiner—R. Alexander Smith
(74) Attorney, Agent, or Firm—Birch, Stewart, Kolasch & Birch, LLP

(57) ABSTRACT

To provide an electrostatic capacitor-type sensor that does not require regulation such as zero-point adjustment and temperature compensation, etc. A pair of semi-circular differential electrodes are positioned next to each other in the vertical direction with a common electrode arranged so as to face the differential electrodes, with a fixed gap therebetween. The pair of differential electrodes and the common electrode are housed within an airtight container, and a dielectric fluid is sealed within the airtight container. The differential electrode on an upper side and the common electrode form an upper variable capacitor, and the differential electrode on the lower side and the common electrode form a lower variable capacitor.

3 Claims, 8 Drawing Sheets

ELECTROSTATIC CAPACITOR-TYPE INCLINATION SENSOR

This application is a divisional of application Ser. No. 09/505,879, filed on Feb. 17, 2000, U.S. Pat. No. 6,311,406, the entire contents of which are hereby incorporated by reference and for which priority is claimed under 35 U.S.C. §120; and this application claims priority of application No. JP 11-039528 filed in JAPAN on Feb. 18, 1999, under 35 U.S.C. §119.

BACKGROUND OF THE INVENTION

1. Field of the Invention

The present invention relates to an electrostatic capacitor-type inclination sensor, with a pair of differential electrodes and a common electrode arranged facing each other within an air-tight container, for detecting changes in the fluid surface level of dielectric fluid introduced into the air-tight container as changes in electrostatic capacitance corresponding to an angle of inclination. More particularly, the present invention relates to an electrostatic capacitor-type inclination sensor that does not require temperature compensation or zero adjustment.

2. Description of Related Art

It is known to provide an inclination sensor mounted on a vehicle such as a motorcycle to detect the inclination of the vehicle and control various parts of the vehicle in response thereto. FIG. 15 is a perspective view of a related art motorcycle mounted with an inclination sensor, viewed from the rear. The inclination sensor 90 attached to, for example, a stay etc. extends forward from the handlebar stem at the front end of a main frame (not shown). The inclination sensor 90 inclines integrally with the main frame, i.e. the vehicle body, regardless of where the helm of handlebars 92 is. The inclination angle is then detected and this angle is detected. An angle signal detected in this manner is then sent to an ECM (engine control module) fixed, for example, to the lower part of a seat 91 towards the rear of the vehicle and is utilized in various control.

Related electrostatic capacitor-type inclination sensors are disclosed in, for example, Japanese Patent Laid-open Publication Nos. Hei. 4-53528 and Hei. 5-14168. FIG. 7 is a vertical cross-section of a related art electrostatic capacitor-type inclination sensor, FIG. 8 is a lateral cross-section, and FIG. 9 is a perspective view of a variable capacitor section.

In the variable capacitor section, a pair of differential electrodes 11a and 11b are arranged next to each other in a horizontal direction and a common electrode plate 12 is provided parallel with the differential electrodes 11a and 11b, with a fixed gap remaining between the differential electrodes 11a and 11b and the common electrode plate 12. The differential electrodes 11a and 11b and the common electrode plate 12 are housed in an airtight container 14. The airtight container 14 is filled up to approximately half its effective capacity with a dielectric fluid 13 such as silicon oil. Each of the differential electrodes 11a and 11b and the common electrode plate 12 form variable capacitors Ca and Cb.

FIG. 10 shows an example of a circuit for converting changes in capacitance of the variable capacitors Ca and Cb into changes in d.c. voltage for a related electrostatic capacitor-type inclination sensor, with an oscillator OSC being connected to the common electrode plate 12. Each of the differential electrodes 11a and 11b are connected to capacitance/voltage conversion circuits CV1 and CV2 for converting changes in capacitance to changes in d.c. voltage. Each of the differential electrodes 11a and 11b are connected to capacitance/voltage conversion circuits CV1 and CV2 for converting changes in capacitance into changes in d.c. voltage. Output signals of the capacitance/voltage conversion circuits CV1 and CV2 are inputted to a differential amplifier DA and the output of this differential amplifier DA is a d.c. signal corresponding to the angle of inclination of the sensor.

A zero-point adjustment circuit 81 controls the capacitance/voltage conversion circuit CV2 in such a manner that the output voltage of the differential amplifier DA becomes 0V when the sensor is horizontal. A temperature compensation circuit 82 controls the amplification factor of the differential amplifier DA according to the atmospheric temperature in such a manner that an output corresponding to the angle of inclination of the sensor is obtained regardless of the temperature.

FIG. 11 is a view showing the relationship between electrostatic capacitances Ca and Cb of the variable capacitors Ca and Cb (in the following, the electrostatic capacitors of the variable capacitors are expressed as the numerals given to the variable capacitors) and the angle of inclination of the sensor, with this relationship being shown as changes of temperature and individual differences within a range shown by broken lines.

On the other hand, in the related technology, the output of the differential amplifier DA representing the angle of inclination of the sensor is a function of the difference of the electrostatic capacitances of the variable capacitors Ca and Cb. When the electrostatic capacitances of the variable capacitors C1 and C2 change according to temperature and individual differences, the difference between the electrostatic capacitances (Ca−Cb) also changes within the range of the broken lines as shown in FIG. 12.

In the above related technology, at least one of the capacitance/voltage conversion circuits CV1 and CV2 has to be zero point-adjusted by the zero-point adjustment circuit 81 for each sensor so that the output of the differential amplifier DA becomes "0" when the difference is "0." It is also necessary to carry out temperature compensation for each sensor at the temperature compensation circuit 82. However, particularly when the sensor is mounted on a vehicle such as a motorcycle, in addition to it not being easy to accurately perform zero point adjustment and temperature compensation when the vehicle is in motion, there are also increases in cost and weight.

SUMMARY OF THE INVENTION

In order to resolve the aforementioned problems, it is the object of the present invention to provide a low-cost electrostatic capacitor-type inclination sensor where regulators such as zero-point adjusters and temperature compensators etc. are not required. In order to achieve the aforementioned object, the present invention includes the following:

(1) In an electrostatic capacitor-type inclination sensor, with a pair of differential electrodes and a common electrode arranged facing each other within an air-tight container, for detecting changes in the fluid surface level of dielectric fluid introduced into the air-tight container as changes in electrostatic capacitance corresponding to an angle of inclination, the pair of differential electrodes are arranged next to each other in a vertical direction with respect to the fluid surface level when the fluid surface level is horizontal.

(2) An electrostatic capacitor-type inclination sensor with a pair of adjacent differential electrodes and a common electrode arranged facing each other within an air-tight container, for detecting changes in the fluid surface level of dielectric fluid introduced into the air-tight container as changes in electrostatic capacitance corresponding to an angle of inclination, comprises:

variable capacitance means configured from a pair of variable capacitors constituted by the pair of differential electrodes and the common electrode connected in series across a power supply;

reference capacitance means constituted by a pair of reference capacitors connected in series across a power supply; and differential amplifier means, in which a common connection point of the variable capacitors of the variable capacitance means serves as one differential input, and a common connection point of reference capacitors of the reference capacitor serves as another differential input.

According to feature (1), the electrostatic capacitances of each of the variable capacitors formed across the differential electrodes and the common electrode both exhibit maximum values in a horizontal state with no inclination regardless of individual differences. Zero-point adjustment to define the angle at which each capacitor exhibits a maximum value is therefore not necessary.

According to feature (2), the output signal of the differential amplifier means is proportional to a change in electrostatic capacitance ΔC of the pair of variable capacitors formed across the pair of differential electrodes and common electrode of the electrostatic capacitance section. Temperature compensation is also not required because the temperature coefficient is nullified and there is no dependence on temperature.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 16 is a structural view of a control module with an inclination sensor built-in.

DESCRIPTION OF THE PREFERRED EMBODIMENTS

Figure 1:
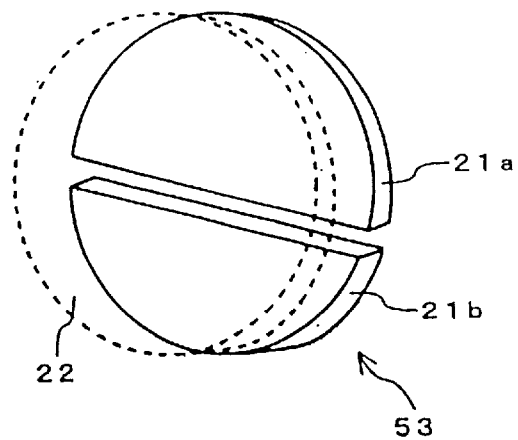
FIG. 1 is a perspective view of an electrostatic capacitance section of an electrostatic capacitor-type inclination sensor of a first embodiment of the present invention.

The following is a detailed description, with reference to the drawings, of the present invention. FIG. 1 is a perspective view of an electrostatic capacitor 53 for an electrostatic capacitor-type inclination sensor constituting a first embodiment of the present invention, where a pair of semi-circular-shaped differential electrodes 21a and 21b are arranged vertically next to each other and a common electrode 22 is arranged in parallel with a fixed gap between them so as to face the differential electrodes 21a and 21b.

The pair of differential electrodes 21a and 21b and the common electrode 22 are housed within an airtight container (not shown) as in the related art, and a dielectric fluid (not shown) is sealed within the airtight container. The differential electrode 21a on an upper side and the common electrode 22 form an upper variable capacitor C1, and the differential electrode 21b on the lower side and the common electrode 22 form a lower variable capacitor C2.

Figure 2:
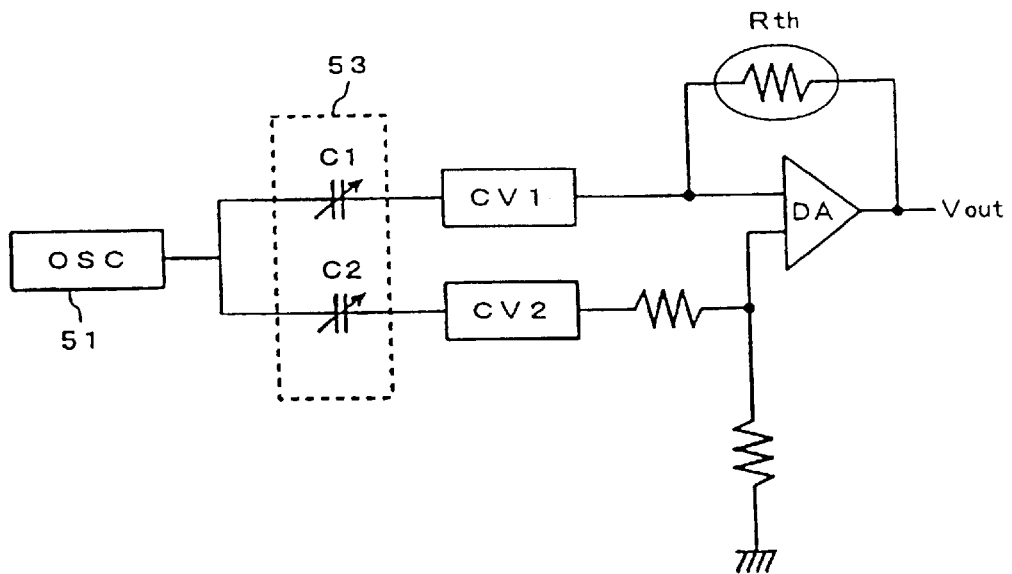
FIG. 2 is a block diagram of an electrostatic capacitor-type sensor of the first embodiment.

FIG. 2 is a block diagram of an electrostatic capacitor-type inclination sensor that employs an electrostatic capacitor 53 of the aforementioned electrode configuration to detect changes in the fluid surface level of the dielectric fluid as an inclination angle. Numerals the same as previous numerals represent the same or equivalent portions.

At the electrostatic capacitor 53, the differential electrodes 21a and 21b of the variable capacitors C1 and C2 are arranged next to each other in the vertical direction with respect to the fluid surface level when horizontal, as shown in FIG. 1. The common electrode 22 is then provided facing the differential electrodes 21a and 21b, with a fixed gap therebetween. The common electrode 22 for each of the variable capacitors C1 and C2 is connected to an oscillating circuit 51 for generating an alternating current signal of a prescribed frequency. The differential electrode 21a of the variable capacitor C1 is connected to an input terminal of the first capacitance/voltage conversion circuit CV1 and the differential electrode 21b of the variable capacitor C2 is connected to an input terminal of the second capacitance/voltage conversion circuit CV2.

The outputs of the first and second capacitance/voltage conversion circuits CV1 and CV2 are connected to the differential input terminals of the differential amplifier DA. A thermistor Rth for use in temperature compensation for exerting control to give an appropriate amplification factor for the differential amplifier DA according to the atmospheric temperature is connected across the output terminal of the differential amplifier DA and one of the differential input terminals. A control circuit (not shown) is connected to the output terminal of the differential amplifier DA so that a d.c. signal corresponding to an angle of inclination θ of the sensor is outputted as a function of the difference (C1−C2) between the electrostatic capacitances of the variable capacitors C1 and C2.

Figure 3A:
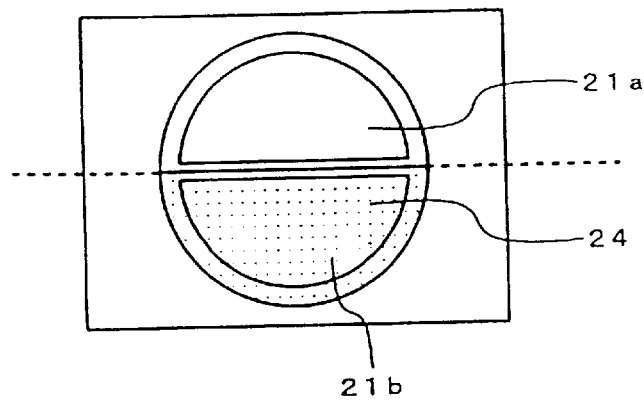
FIGS. 3(a) to 3(c) are views showing the relationship between each of the differential electrodes and the fluid surface level of the first embodiment.
Figure 3B:
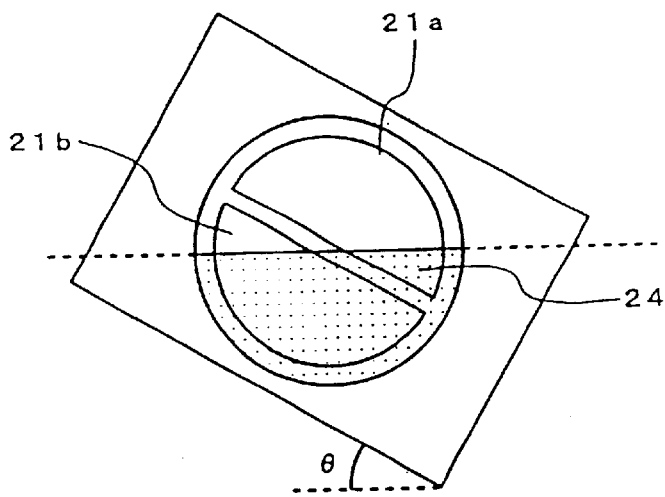
Figure 3C:
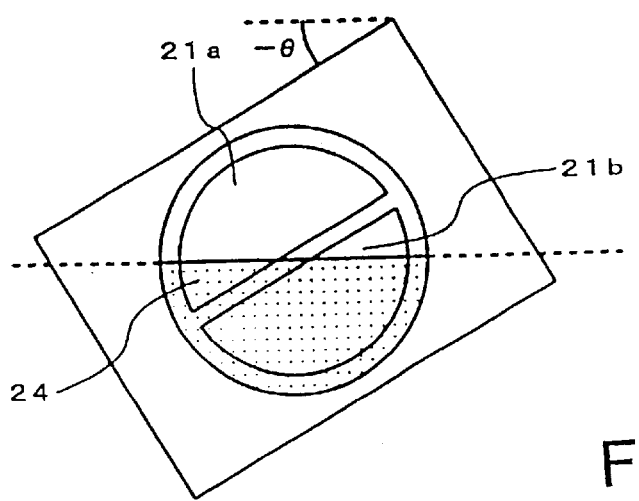

FIGS. 3(a) to 3(c) are views showing a typical relationship between the fluid surface level of the dielectric fluid 24 in the electrostatic capacitor 53 and the inclination angle θ. The dielectric fluid 24 is introduced to an extent that the fluid surface level reaches the neighboring region of the differential electrodes 21a and 21b when horizontal.

Figure 4:
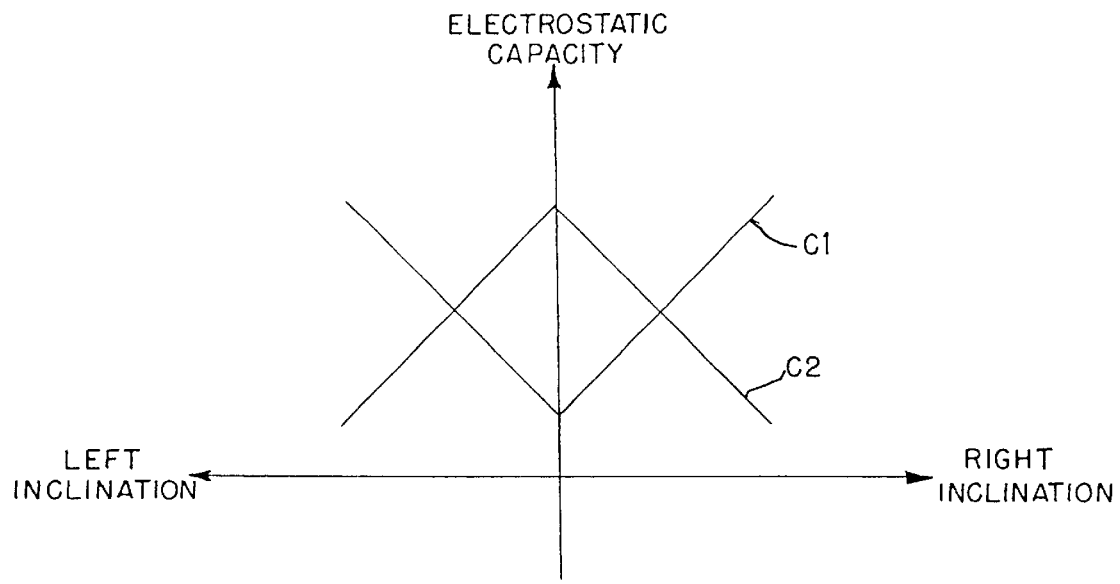
FIG. 4 is a view showing the relationship between the electrostatic capacity Q1 and Q2 of each capacitor and the angle of inclination in the present invention.

FIG. 4 is a view showing the relationship between electrostatic capacitances C1 and C2 of the variable capacitors C1 and C2 and the angle of inclination θ in this embodiment. As shown in FIG. 3(b) and FIG. 3(c), when the sensor is inclined to the right or left side, the electrostatic capacitance falls by the extent of the incline at the lower variable capacitor C2 and the electrostatic capacitance rises by the extent of the incline at the upper variable capacitor C1.

Figure 5:
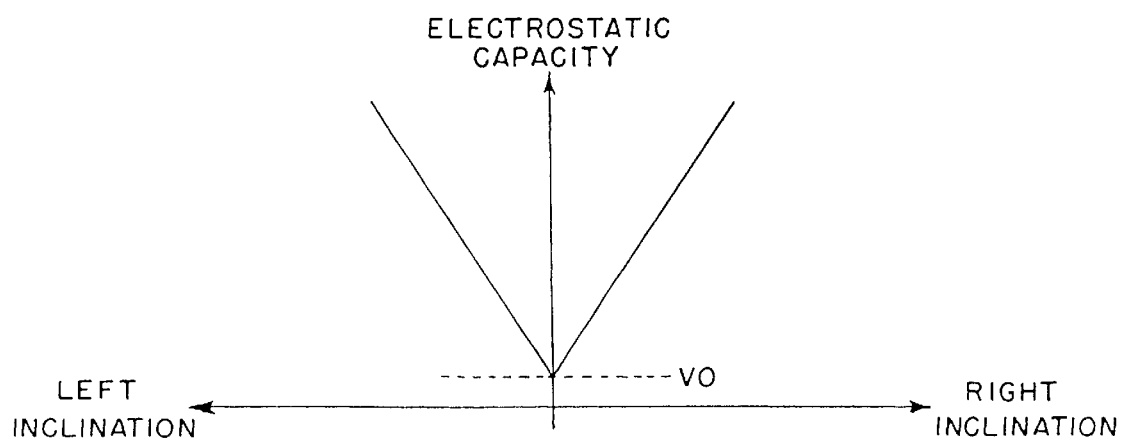
FIG. 5 is a view showing the relationship between sensor output and angle of inclination in the present invention.

According to this embodiment, the upper and lower variable capacitors C1 and C2 usually exhibit extreme values in a horizontal state regardless of individual differences and the difference for the variable capacitors C1 and C2, i.e. the output signal of the differential amplifier DA also exhibits extreme values in the horizontal state regardless of individual differences between the variable capacitors, as shown in FIG. 5. It is therefore possible to assemble the electrostatic capacitor-type inclination sensor without providing zero point adjustment, if when the electrostatic capacitor-type inclination sensor is assembled, a control device is connected to the rear part of the differential amplifier DA, the output signal of the differential amplifier DA is monitored, and the angle of inclination is calculated taking a value V0 indicating an extreme value as the horizontal state.

Figure 16:
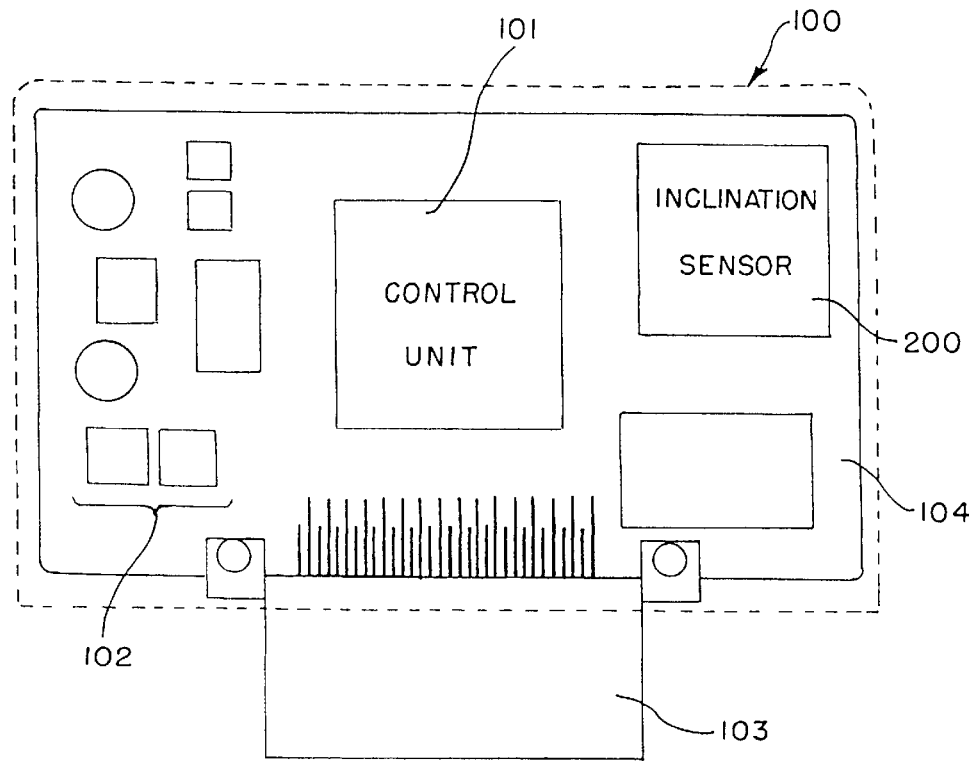
Figure 15:
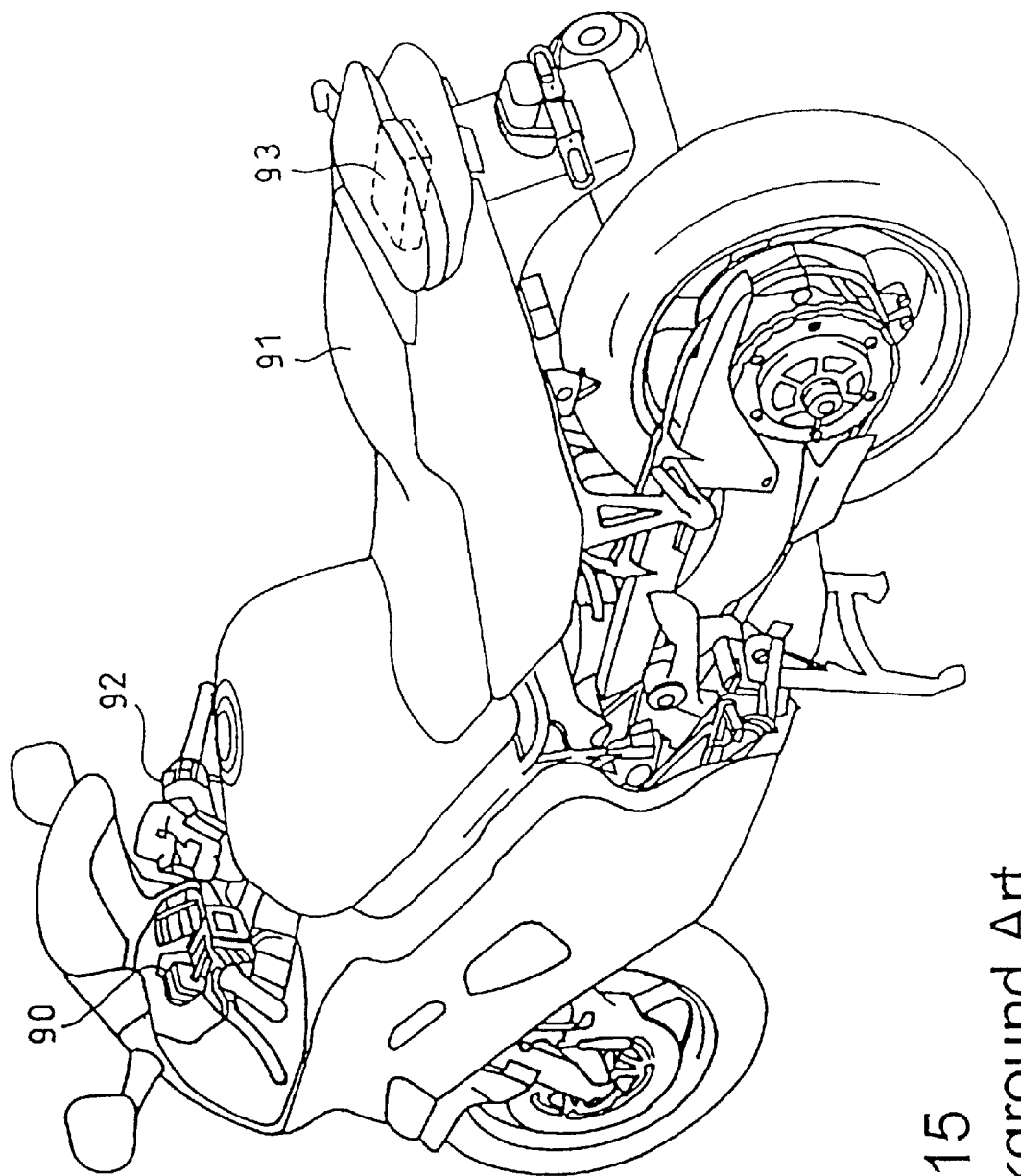
FIG. 15 is a perspective view from the rear of a related art motorcycle mounted with an inclination sensor.

FIG. 16 is a view showing an example of a method of applying the electrostatic capacitor-type inclination sensor to a motorcycle. In this embodiment, an electrostatic capacitor-type inclination sensor 200 of the above configuration is provided within an ECM 100 for carrying out fuel injection control and ignition control.

The electrostatic capacitor-type inclination sensor 200 of this embodiment is provided on a substrate 104 at the ECM 100 together with a control unit 101 for carrying out fuel injection and ignition control, various discreet parts 102 and a connector 103. The ECM 100 can be fixed to the vehicle frame at the lower part of the seat, causing the ECM 100 to incline together with the seat and the motorcycle itself.

If the electrostatic capacitor-type inclination sensor is provided within the ECM, the number of attachment processes can be reduced compared with the case where the inclination sensor and the ECM are attached to the vehicle seperately. The influence of noise and parasitic capacitance can also be kept to a minimum because the wiring for connecting the ECM and the inclination sensor can be made short, and the connection can therefore be electrically stable.

Figure 6:
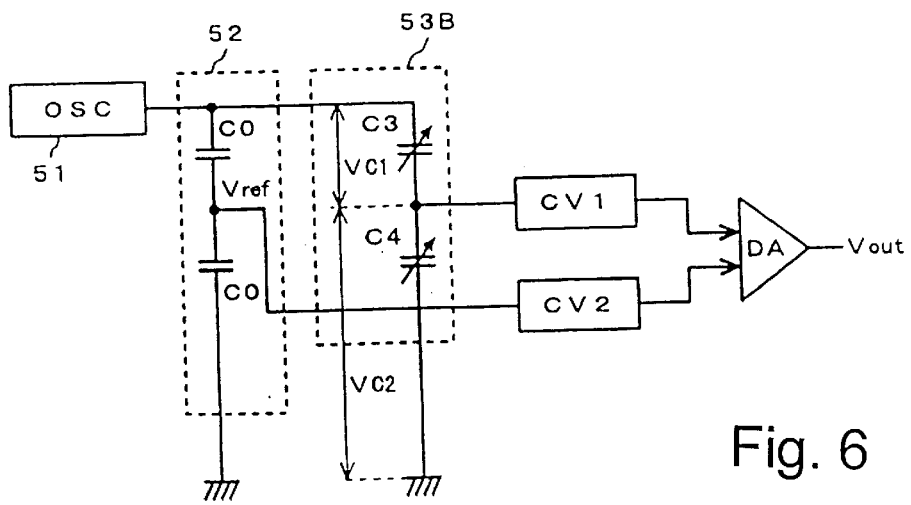
FIG. 6 is a block diagram of a second embodiment of the present invention.
Figure 7:
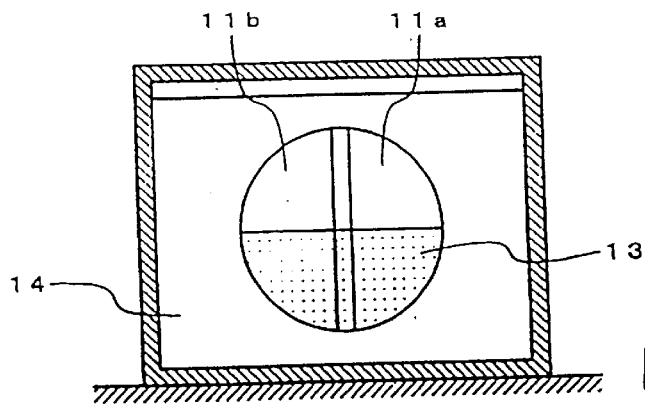
FIG. 7 is a vertical cross-section of a related art electrostatic capacitor-type inclination sensor.
Figure 8:
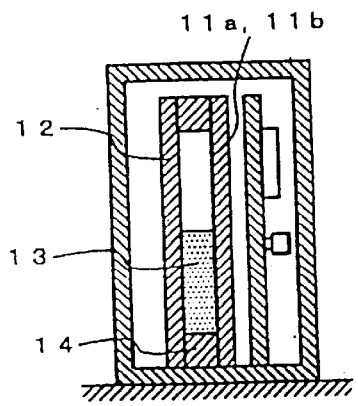
FIG. 8 is a further vertical cross-section of a related art electrostatic capacitor-type inclination sensor.
Figure 9:
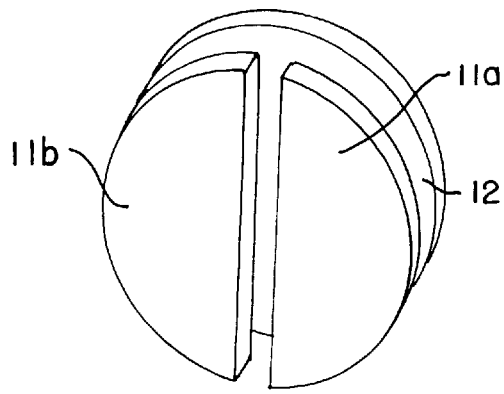
FIG. 9 is a perspective view of an electrostatic capacitor section of a related art electrostatic capacitor-type inclination sensor.
Figure 10:
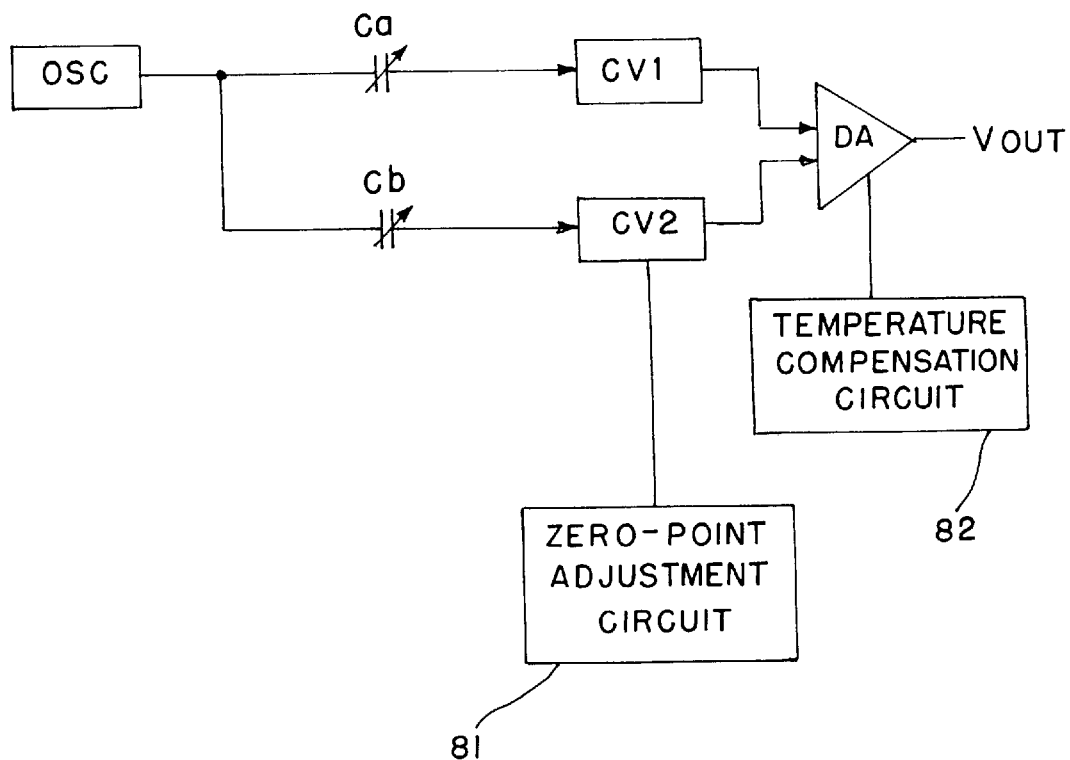
FIG. 10 is a block diagram of a related art electrostatic capacitor-type inclination sensor.
Figure 11:
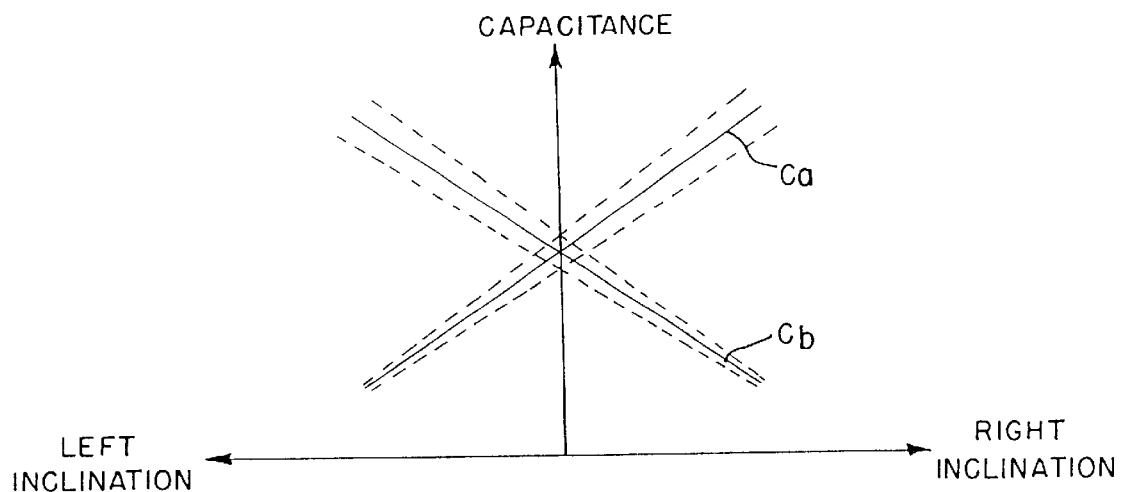
FIG. 11 is a view showing the relationship between the electrostatic capacity of variable capacitors Ca and Cb of a related art electrostatic capacitor-type inclination sensor and the angle of inclination.
Figure 12:
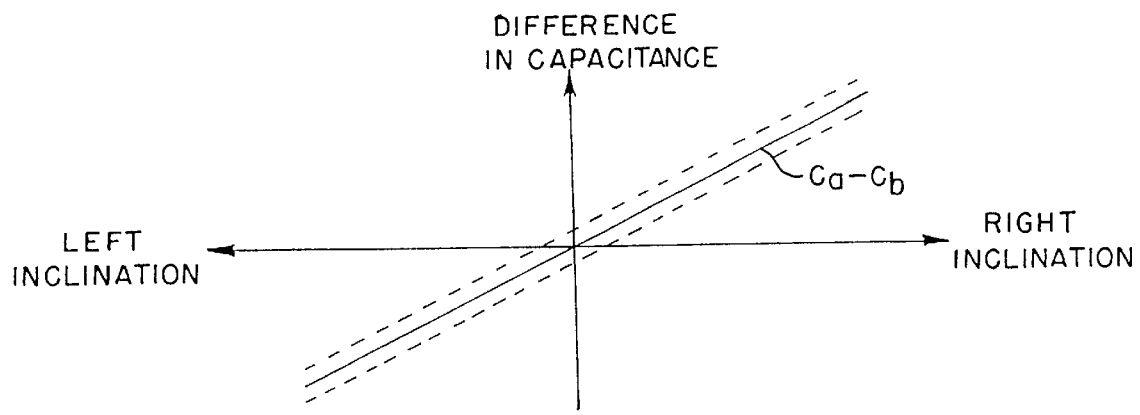
FIG. 12 is a view showing the relationship between the output of a related art electrostatic capacitor-type inclination sensor and the angle of inclination.

Next, a description is given of a further embodiment of the present invention. FIG. 6 is a block diagram of an electrostatic capacitor-type inclination sensor of the second embodiment of the present invention, with numerals the same as previous numerals representing the same or equivalent portions With an electrostatic capacitor section 53B of this embodiment, a pair of differential electrodes are arranged next to each other in the horizontal direction as in the related art shown in FIG. 9. A reference capacitor section 52 comprises two reference capacitors C0 connected in series, with one end connected to the OSC 51 and the other end connected to ground. At the electrostatic capacitor section 53B, the differential electrode 11a composing one of the variable capacitors C3 is connected to OSC 51, and the differential electrode 11b composing the other variable capacitor C4 is connected to ground.

The common electrode of the electrostatic capacitor section 53B is connected to the input terminal of the first capacitance/voltage conversion circuit CV1 and the input terminal of the second capacitance/voltage conversion circuit CV2 is connected to a connection part of each reference capacitor C0 in the reference capacitor section 52. Output signals of the first and second capacitance/voltage conversion circuits CV1 and CV2 are inputted to each of the differential input terminals of the differential amplifier DA and, as described hereafter, d.c. signals corresponding to the angle of inclination θ of the sensor are expressed at the output terminal of the differential amplifier DA as a function of a change in capacitance ΔC of variable capacitors C3 and C4.

In FIG. 6, the relationship between voltages Vc1 and Vc2 across terminals of the variable capacitors C3 and C4 and an output voltage V of the OSC 51 is given by the following equation (1).

$$V = Vc1 + Vc2 \tag{1}$$

The following equation (2) is then satisfied because the amount of charge Q accumulated at the variable capacitors C3 and C4 connected in series is equal.

$$Q = C3 \cdot Vc1 = C4 \cdot Vc2 \tag{2}$$

Then, from the above equations (1) and (2);

$$Vc2 = (C3/C4) \cdot Vc1 \tag{3}$$
$$= (C3/C4) \cdot (V - Vc2)$$

and, rearranging equation (3);

$$Vc2 = (C3/(C3+C4)) \cdot V \tag{4}$$

When the sensor is inclined, the variable capacitance of the variable capacitor C3 is changed to C+ΔC, the capacitance of the variable capacitor C4 is changed to C−ΔC, and equation (4) becomes as follows.

$$Vc2 = ((C + \Delta C)/((C + \Delta C) + (C + \Delta C))) \cdot V \tag{5}$$
$$= ((C + \Delta C)/2C) \cdot V$$
$$= V/2 + (\Delta C/2C) \cdot V$$

On the other hand, a differential input voltage Vref for the connection point at the reference capacitor section 52 can be expressed as follows.

$$Vref = V/2 \tag{6}$$

From the above equations (5) and (6), a differential output Vout of the differential amplifier DA is given by equation (7) and is proportional to the variation in capacitance ΔC.

$$V_{out} = V_{c2} - V_{ref} \quad (7)$$

$$= (V/2C) \cdot \Delta C$$

If the temperature coefficients for the reference capacitors C0 of the reference capacitor section 52 and for the variable capacitors C3 and C4 of the electrostatic capacitor section 53B are taken to be k, the differential input voltage Vref of the reference capacitor section 52 is expressed by the following equation (8).

$$V_{ref} = (k \cdot C / (k \cdot C + k \cdot C)) \cdot V \quad (8)$$

$$= V/2$$

With regards to this, a differential input voltage Vc2 of a connection point at the electrostatic capacitor section 53B can be expressed by the following equation (9).

$$VC2 = (k(C + \Delta C)/(k(C + \Delta C) + k(C - \Delta C))) \cdot V \quad (9)$$

$$= V/2 + (\Delta C / 2C) \cdot V$$

The differential output Vout of the differential amplifier DA is then given by the following equation.

$$V_{out} = V_{c2} - V_{ref} \quad (10)$$

$$= (V/2C) \cdot \Delta C$$

In this embodiment, the temperature coefficient k is therefore nullified by either the differential input voltage Vref of the reference capacitor section 52 or the differential input voltage Vc2 of the electrostatic capacitor section 53B. The output Vout of the differential amplifier DA is not temperature dependant and temperature compensation is therefore possible without providing a separate temperature compensation circuit.

Figure 13:
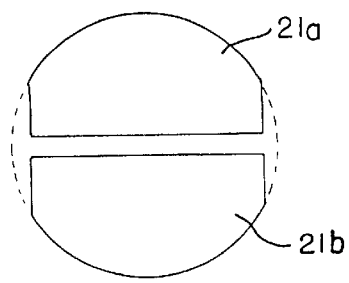
FIG. 13 is a plan view showing a modified example of differential electrodes of the electrostatic capacitance section of the present invention.
Figure 14:
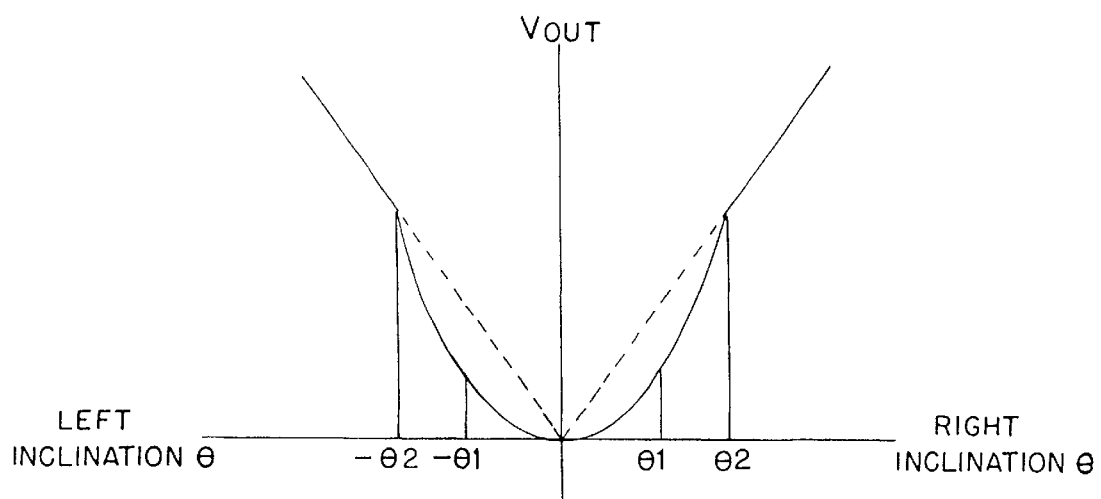
FIG. 14 is a view showing the relationship between the differential output of the modified example of FIG. 13 and the angle of inclination.

In the second embodiment, the electrode structure of the electrostatic capacitor section 53B is described as being the structure of the related art where a pair of differential electrodes are arranged next to each other in the horizontal direction. However, if a structure where a pair of differential electrodes are arranged next to each other in the vertical direction is adopted as in the first embodiment described in FIG. 1, not only the temperature compensation circuit but also the zero point adjustment circuit is no longer necessary. When a shape such as that shown in FIG. 13 where the ends of the shapes of the differential electrodes 21a and 21b positioned next to each other in the vertical direction are trimmed, the relationship between the output Vout of the differential amplifier DA and the angle of inclination θ becomes a quadratic function within the practical range of detection (within ±θ2). The rate of change of the output Vout with respect to the angle of inclination θ can therefore be made larger than for other ranges in the range where the angle of inclination is large.

Generally, when the range of inclination at the time of normal travel of a motorcycle is in an angle of inclination of ±θ1, small differences with this angle of inclination present little problem. In this regard, the relatively large range of inclination exceeding ±θ2 is when a vehicle is travelling in a manner different to normal as in cases where strict control is demanded based on the angle of inclination θ, and small differences in the angle of inclination therefore become important.

In this embodiment, the rate of change of the output Vout with respect to the angle of inclination θ is large in the range for a relatively large angle of inclination (±θ1) requiring control based on the angle of inclination and small differences in the angle of inclination can therefore be detected.

In the above embodiments, if the inclination sensor is built-into the control module, the number of attaching steps can be reduced compared with when the inclination sensor and the control module are individually attached and the electrical connection between the inclination sensor and the control module can be made stable.

According to the present invention, the following results are achieved.

(1) According to a first aspect of the present invention, the electrostatic capacitances of each of the variable capacitors formed across the differential electrodes and the common electrode both exhibit maximum values in a horizontal state with no inclination regardless of individual differences. Zero-point adjustment to define the angle at which each variable capacitor exhibits a maximum value is therefore not necessary.

(2) According to a second aspect of the present invention, the output signal of the differential amplifier means is proportional to a change in electrostatic capacitance ΔC of the pair of variable capacitors formed across the pair of differential electrodes and common electrode of the electrostatic capacitance section. Temperature compensation is also not required because the temperature coefficient is nullified and there is no dependence on temperature.

(3) Zero-point adjustment and temperature compensation are not necessary, and the present invention is particularly suited to being mounted on a vehicle such as a motorcycle due to being cheap and lightweight.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An electrostatic capacitor-type inclination sensor for detecting changes in the fluid surface level of a dielectric fluid introduced into an air-tight container as changes in electrostatic capacitance corresponding to an angle of inclination, comprising:

a pair of adjacent differential electrodes;

a common electrode arranged facing each of said pair of adjacent differential electrodes within the air-tight container;

variable capacitance means configured from a pair of variable capacitors constituted by the pair of differential electrodes and the common electrode connected in series across a power supply;

reference capacitance means constituted by a pair of reference capacitors connected in series across the power supply; and differential amplifier means, in which a common connection point of the variable capacitors of the variable capacitance means serves as one differential input, and a common connection point of the reference capacitors of the reference capacitance means serves as another differential input.

2. The electrostatic capacitor-type inclination sensor of claim 1, wherein the pair of differential electrodes are arranged next to each other in a horizontal direction with respect to the fluid surface level when the fluid surface level is horizontal.

3. The electrostatic capacitor-type sensor of claim 1, wherein the pair of differential electrodes are arranged next to each other in a vertical direction with respect to the fluid surface level when the fluid surface level is horizontal.

* * * * *